United States Patent
Chou et al.

(10) Patent No.: US 7,415,257 B2
(45) Date of Patent: Aug. 19, 2008

(54) DUAL-BAND MIXER AND ITS DESIGN FLOW

(75) Inventors: Mei-Fen Chou, HsinChu (TW);
Kuei-Ann Wen, 1001, TaShueh Rd., HsinChu (TW); Chun-Yen Chang, HsinChu (TW)

(73) Assignee: Kuei-Ann Wen, Hsinchu (TW)

( * ) Notice: Subject to any disclaimer, the term of this patent is extended or adjusted under 35 U.S.C. 154(b) by 531 days.

(21) Appl. No.: 11/249,476

(22) Filed: Oct. 14, 2005

(65) Prior Publication Data
US 2007/0087710 A1 Apr. 19, 2007

(51) Int. Cl.
*H04B 1/26* (2006.01)
*H04B 1/28* (2006.01)
(52) U.S. Cl. .................. 455/130; 455/326; 455/333
(58) Field of Classification Search .............. 455/118, 455/293, 323–326, 333; 327/359
See application file for complete search history.

(56) References Cited

U.S. PATENT DOCUMENTS 6,026,286 A * 2/2000 Long .................. 455/327
6,057,714 A * 5/2000 Andrys et al. ............. 327/105
6,640,091 B1 * 10/2003 Shiraishi ................. 455/118
6,812,771 B1 * 11/2004 Behel et al. .............. 327/359
6,828,844 B2 * 12/2004 Suzuki et al. ............. 327/359
6,959,178 B2 * 10/2005 Macedo et al. ............ 455/313
2002/0065061 A1 * 5/2002 Schiltz ................. 455/326
2003/0064698 A1 * 4/2003 Kim et al. ................ 455/313

* cited by examiner

*Primary Examiner*—Simon D Nguyen
(74) *Attorney, Agent, or Firm*—Bacon & Thomas, PLLC.

(57) ABSTRACT

In the dual-band mixer of this invention, a current combined load is presented and is shared by two separate working frequency bands. In the invented dual-band mixer, a switch is provided to connect and disconnect an adjust capacitor series to the load inductors. By determining the capacitance of respective capacitors and the inductance of the load inductors, it is possible to generate resonance with related parasitic capacitances at particular frequencies, such that value of the load inductors may be changed. This enables the invented mixer to work with selected frequencies according to the operation of the switches. In addition, a systematic methodology is proposed to implement the design of the invented dual-band mixer. The efficient design method is approved by a 2.4/5.2-GHz CMOS mixer implementation.

11 Claims, 5 Drawing Sheets

(a)

(b)

DUAL-BAND MIXER AND ITS DESIGN FLOW

FIELD OF THE INVENTION

The present invention relates to a dual-band mixer for use in wireless communications, especially to a mixer that is able to work with two separate bandwidths with reduced number of components and die size.

BACKGROUND OF THE INVENTION

Due to the wide application of the wireless communications nowadays, lower-cost and wider-bandwidth wireless communications devices have been a target of research and development in the industry. In order to satisfy the needs in the wireless applications, the industry has been driven to migrate to the 2-6 GHz frequency range. For wireless LAN applications, industrial standards target the carrier frequency to either the 5.2-GHz band, by the IEEE 802.11a standard, or the 2.4-GHz band, by the IEEE 802.11g standard. Dual-band transceivers are thus proposed by the industry to provide more flexible and convenient usages of the wireless LAN systems.

Among the dual-band transceivers as announced, most of them contain two different mixers in one transceiver chip. Under such a design, circuit of the transceiver chip is made even complicated and dimension of the chip would be made twice that of a single-band mixer, since all the circuit elements are duplicated. Among all the elements inductors at the load are the most space-consuming component, since 4 load inductors, 2 for each mixer, are required in the differential architecture of the circuit. This becomes a main obstacle in reducing the cost of dual-band applications.

In order to shrink the chip size, it is possible to merge two mixers into a single mixer. This may reduce number of inductors at load in the differential architecture from 4 to 2. However, the load of the mixer was designed to operate at only one specific frequency. As a result, such dual-band mixer can only be used in a dual-band receiver, not a dual-band transmitter. A load that can be shared by two bands was proposed by using a band pass filter with a notch at output to divide the pass band into two different bands. See S. Lavasani et al.: "Pseudo-concurrent 0.18/spl mu/m dual-band CMOS LNA," Radio Frequency Integrated Circuits (RFIC) Symposium, pp. 8-10, June 2003. The circuit was simplified because 2 bands used shared elements. Unfortunately, under such a design an extra inductor was added to the load to introduce the notch. As a consequence, it still required 4 inductors at load to form a differential architecture.

It is thus necessary to provide a novel dual-band mixer wherein elements may be shared by two bands and no additional inductor will be needed.

It is also necessary to provide a dual-band mixer wherein working frequency bands may be easily selected.

OBJECTIVES OF THE INVENTION

The objective of this invention is to provide a novel dual-band mixer.

Another objective of this invention is to provide a dual-band mixer wherein elements may be shared by two bands without the need of additional inductor.

Another objective of this invention is to provide a dual-band mixer wherein working frequency bands may be easily selected.

Another objective of this invention is to provide a low-cost and small-size dual-band mixer.

Another objective of this invention is to provide a method to implement the design of dual-band mixers.

SUMMARY OF THE INVENTION

According to this invention, a dual-band mixer is disclosed. In the dual-band mixer of this invention, a current combined load is presented and is shared by two separate working frequency bands. In the invented dual-band mixer, a switch is provided to connect and disconnect an adjust capacitor series to the load inductors. By determining the capacitance of respective capacitors and the inductance of the load inductors, it is possible to generate resonance with related parasitic capacitances at particular frequencies, such that value of the load inductors may be changed. This enables the invented mixer to work with selected frequencies according to the operation of the switches. In addition, a systematic methodology is proposed to implement the design of the invented dual-band mixer. The efficient design method is approved by a 2.4/5.2-GHz CMOS mixer implementation.

These and other objectives and advantages of this invention may be clearly understood from the detailed description by referring to the following drawings.

DETAILED DESCRIPTION OF THE INVENTION

It is known that most radio frequency CMOS mixers are implemented using the popular Gilbert-type double balanced active mixer. In the following description, the dual-band mixer of this invention will be described using the Gilbert-type mixer as an example. It should be understood that the dual-band mixer of this invention may be applied in mixers of other architectures or designs.

Dual-Band Mixer

Figure 1:
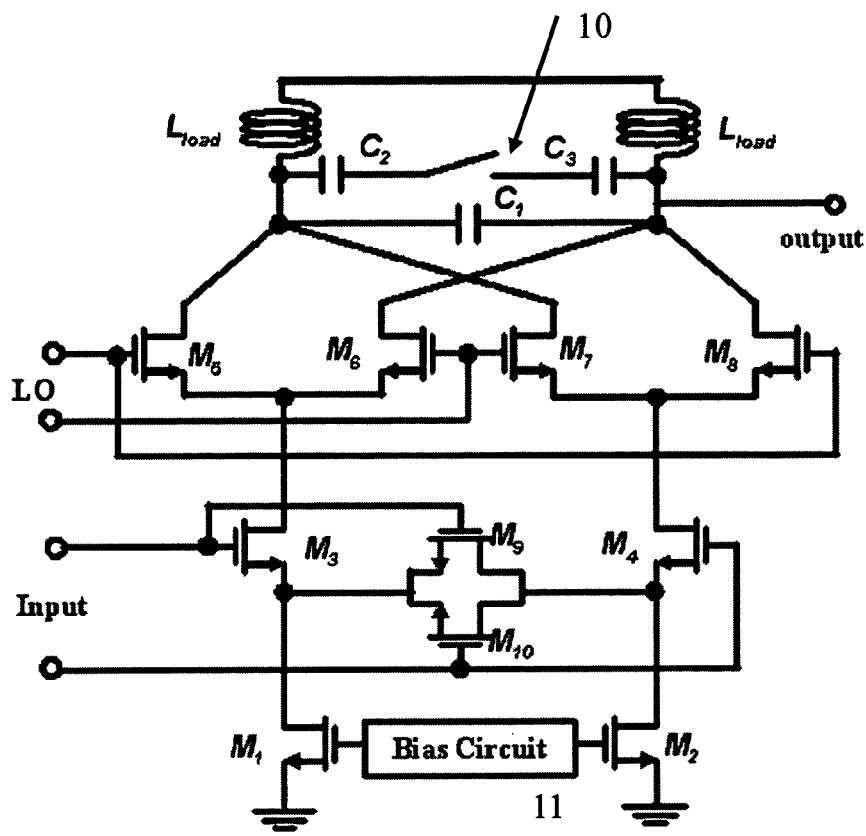
FIG. 1 shows the circuit diagram of an embodiment of the dual-band mixer of this invention.

A dual-band mixer of the present invention will be described hereinafter. FIG. 1 shows the circuit diagram of an embodiment of the dual-band mixer of this invention. As shown in this figure, the mixer is a Gilbert-type double balanced active mixer, which is sometimes called "Gilbert cell" or "Gilbert multiplier) and comprises a first differential amplifier and two second differential amplifiers connected in series to the first differential amplifier. The two inputs of the first differential amplifier are received radio frequency signals and the two inputs of both second differential amplifiers are local oscillator signals. The received radio frequency signals are thus mixed with the local oscillator signals to generate intermediate frequency signals. As the Gilbert-type double balanced active mixer is known to those skilled in the art, detailed description is thus omitted.

Now refer to FIG. 1. As shown in this figure the dual band mixer of this embodiment has at its output: 2 load inductors Lload, Lload, a main capacitor C1 to connect the load inductors Lload, Lload, 2 adjust capacitors C2, C3 connected in parallel with main capacitor C1 and connected/disconnected by transistor 10 as switch. 2 transistors M1 and M2 controlled by bias circuit 11 provide the tail current. 2 transistors M3 and M4 as input transconductors to convert differential input base band signals into current. Transistors M5-M8 work as the switch stage; their inputs are local oscillator signals LO. Transistors M9-M10 provides resistive degeneration to suppress third-order distortion.

2 Load inductors Lload, Lload function as load stage to increase voltage headroom and to minimize process variation for the purpose of integration. The 2 inductors Lload, Lload are recommended to have about the same inductance. Of course, it is possible to use 2 inductors with different inductances and number of inductors is not limited to 2. It is also possible to use 1 or more than 2 load inductors to function as load. The main capacitor C1 and the adjust capacitors C2 and C3 are used to perform current combination, so that differential output of the mixer may be converted into the single-ended form. Main capacitor C1 and 2 adjust capacitors C2, C3 may have about the same capacitance. Of course, this is not any limitation to this invention. To switch the working frequency band of the mixer, transistor 10 is used as switch to change the capacitance for current combination by connecting or disconnecting adjust capacitors C2, C3 in parallel with the main capacitor C1. In the embodiment of this invention, the switch may be a large-dimension PMOS transistor. It is understood that other types of transistors or switches may also be used in this invention to determine connection of adjust capacitors C2, C3 with main capacitor C1.

After having optimized the relation between linearity and gain of the mixer, form factors of the MOS transistors and parasitic capacitance at drain nodes of transistors M5, M8 at the switch stage may be fixed. The parasitic capacitance at the drain nodes of the switch stage is herein defined as Cp, which shall be in a range to enable the parasitic capacitance to resonate with load inductors Lload, Lload.

Working with the Higher Frequency Band

For a mixer as shown in FIG. 1 to perform over dual frequency bands, some conditions shall be met. In the following description the first operating frequency, f1, is defined as the higher frequency band and the second operating frequency, f2, the lower frequency band, whereby, f1>f2.

When operating at the higher frequency band f1, since the current combining capacitance required at this band is much smaller in value than that of the lower frequency band, switch 10 is turned off and the adjust capacitors C2 and C3 are disconnected from the load. The load inductance Lload can be represented by an equivalent circuit consisted of two inductors L1 and L2 in parallel as:

$$L_{load} = \frac{L_1 L_2}{L_1 + L_2} \quad (1)$$

Figure 2:
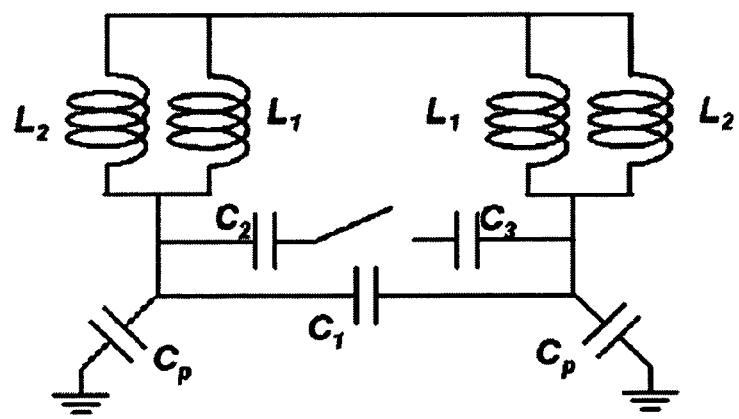
FIG. 2 shows the equivalent circuit of the load of the dual-band mixer of FIG. 1, when working at the higher frequency band.

The equivalent circuit of load of the dual-band mixer when working at band f1 is shown in FIG. 2. By selecting the value of the load inductor Lload, it is possible to make the device parasitic capacitance Cp to resonate with the equivalent inductor L1 at the higher operating frequency band f1.

Both Cp and L1 together act as short circuit when the mixer is operating at frequency band f1, if the following condition is met:

$$\frac{1}{\sqrt{C_p L_1}} = 2\pi f_1 \quad (2)$$

As shown in FIG. 2, only the main capacitor C1 at the load, along with the remaining equivalent inductor L2, performs the current combine operation. Due to the current combine operation, the main capacitor C1 realigns the direction of the differential current to achieve differential to single transform, when the following condition is met, as show in FIG. 3:

$$\frac{1}{\sqrt{2C_1 L_1}} = 2\pi f_1 \quad (3)$$

Figure 3:
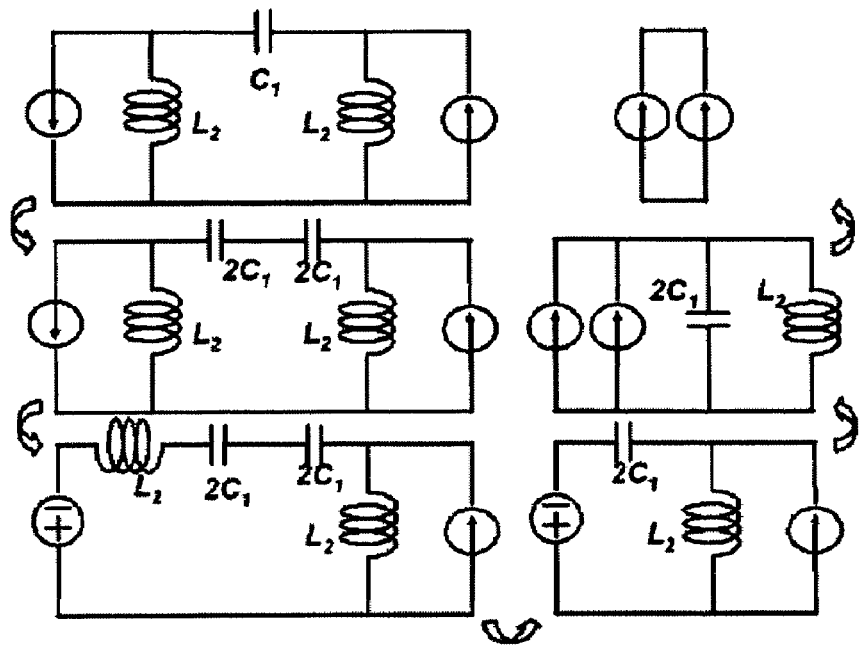
FIG. 3 shows the current combine operation of the dual band mixer at the higher working frequency.

FIG. 3 illustrates steps of the current combine operation of one embodiment of this invention. As shown in this figure, at (a) one side of the current source and the parallel equivalent inductor L2 can be converted to a voltage source and a series inductor with the same value. At (b), the main capacitor C1 can be split into two capacitors with even capacitance, connected in series. In this embodiment, the main capacitor C1 is chosen to meet equation (3). As a consequence, the series inductor and one of the series capacitors jointly act as a short circuit at the higher frequency band f1. The voltage source and series capacitor can be viewed back as a current source and a parallel capacitor. Inductor L2 and series capacitor then act like an open at resonance. At the same time, the load network converts the differential output current of the mixer to a single-ended current.

Working with the Lower Frequency Band

On the other hand, while the mixer is set to the second operating frequency f2, the equivalent inductor pair L2 shall resonate with device parasitic Cp. Thus, Cp and L2 act jointly as a short circuit at frequency band f2, if the following condition is met:

$$\frac{1}{\sqrt{C_p L_2}} = 2\pi f_2 \quad (4)$$

Figure 4:
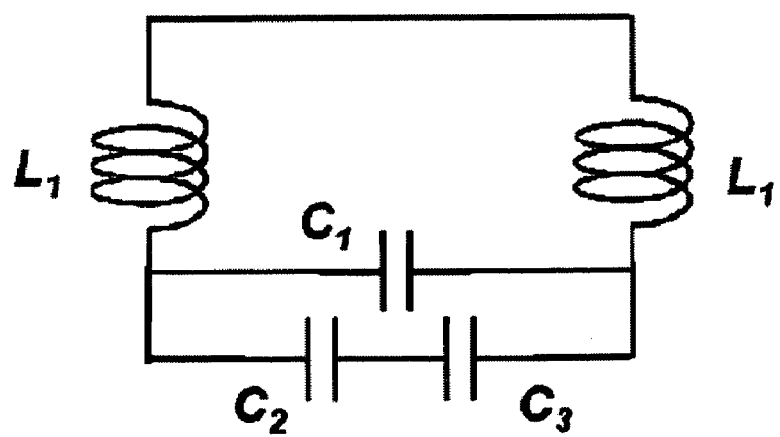
FIG. 4 shows the equivalent circuit of the load of the dual-band mixer of FIG. 1, when working at the lower frequency band.

Switch 10 is turned ON and adjust capacitors C2 and C3 are connected in parallel with main capacitor C1, to perform current combination at the lower frequency band f2. The simplified equivalent circuit of the load is shown in FIG. 4. Together capacitors C1, C2 and C3 form greater capacitance at the load and realign the differential current to achieve differential to single transform with the equivalent inductor pair at the load in condition of:

$$\frac{1}{\sqrt{2\left(C_1 + \frac{C_2 C_3}{C_2 + C_3}\right)L_1}} = \frac{1}{\sqrt{(2C_1 + C_2)L_1}} = 2\pi f_2 \quad (5)$$

The operation of current combiner at the lower frequency band is similar to the steps described in FIG. 3.

The proposed mixer, therefore, can perform dual band operation by the same elements, especially the load. Only two load inductors are required in the proposed mixer to perform dual-band operation for a differential architecture. Compared to the conventional approach which has two mixers, one for each band, and totally four load inductors, two in each mixer, for a differential architecture, the number of load inductors of the proposed mixer is halved by sharing load elements at two bands. By simply setting the connection of the adjust capacitors, the load inductors can perform differential to single up-conversion and reduce parasitic effects at two different frequency bands.

Design Flow

Figure 5:
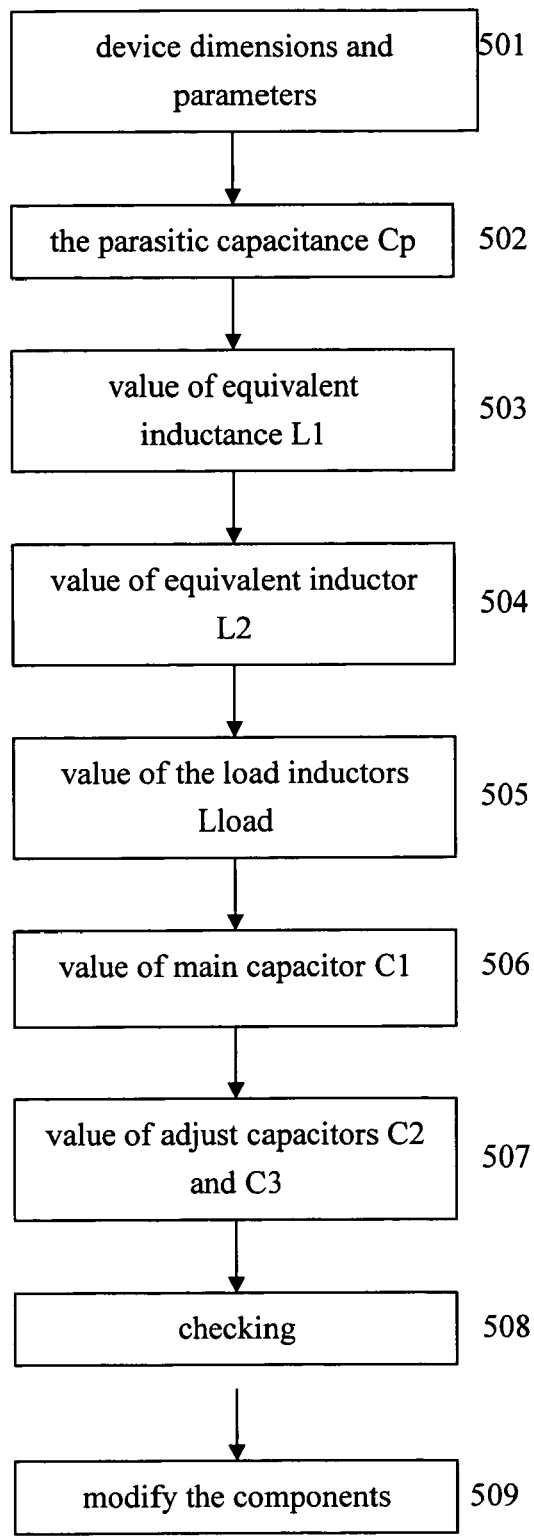
FIG. 5 shows the flowchart of the method for designing a dual-band mixer of this invention.

Based on above design concepts, a design flow for dual band mixer is developed as shown in FIG. 5. FIG. 5 shows the flowchart of the design of one embodiment of the invented dual-band mixer.

In designing the invented dual-band mixer, parameters for the circuitry as shown in FIG. 1 shall be determined first. The parameters include those for the load inductors Lload, the main capacitor C1, the adjust capacitors C2, C3 and working frequencies f1 and f2. As shown in FIG. 5, when designing the dual band mixer of this invention, at 501 structure and parameters of the circuit device is first determined. Obviously, the structure of the dual band mixer is as that of FIG. 1. At 502 modeling software kits are used to calculate the parasitic capacitance Cp at the drain node of the switch stage. At 503 the equivalent inductance L1 required to resonate with Parasitic capacitance Cp may be obtained after optimizing the linearity and the gain. At 504 inductance of the other equivalent inductor L2 is known from equations (3) and (5). At 505 value of the load inductors Lload, which is equivalent to L1 and L2 in parallel, is obtained.

At the higher frequency band f1, the adjust capacitors C2 and C3 are switched off and the main capacitor C1 solely performs current combination. The required combiner capacitance to resonate with equivalent inductor L2 is obtained by equation (4) at 506.

All capacitors C1, C2 and C3 concurrently perform current combination at the lower frequency band f2. The required capacitance for current combination at frequency band f2 is given by equation (6) at 507:

$$C_2 = C_3 = C_p\left(k^2 - \frac{1}{k^2}\right) \quad (6)$$

Herein, parameter k=f1/f2, is the ratio of the two operating frequencies.

By following above procedure, the design of the load including parasitic effects for dual-band mixer is expeditiously accomplished. All the parameters of the load are presented to be in relation with parasitic capacitance and operating frequencies. At 508 compare the results with available cell library, and modify the components if required. An automatic net list generating program can be used to generate a circuit with obtained components, which can be easily integrated with commercial EDA tools to perform circuit simulation, layout, design value check etc, and post-layout simulation. At 509 fine tuning for switch effect is completed to assure design performances.

EFFECTS OF THE INVENTION

Figure 6:
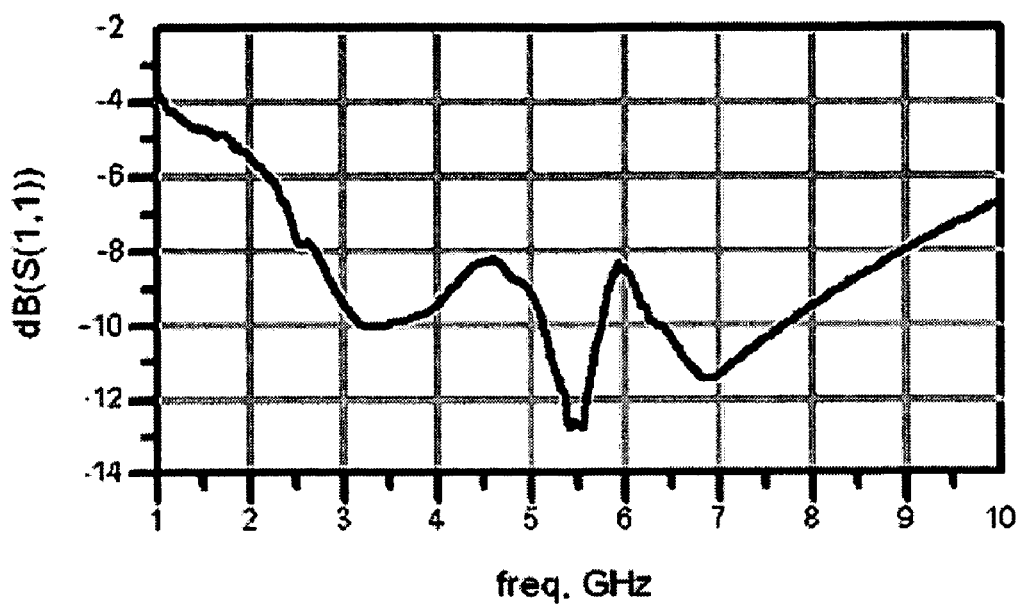
FIG. 6 shows the return losses of one embodiment of the invented dual-band mixer under the frequencies of 5.2 GHz and 2.2 GHz.
Figure 6:
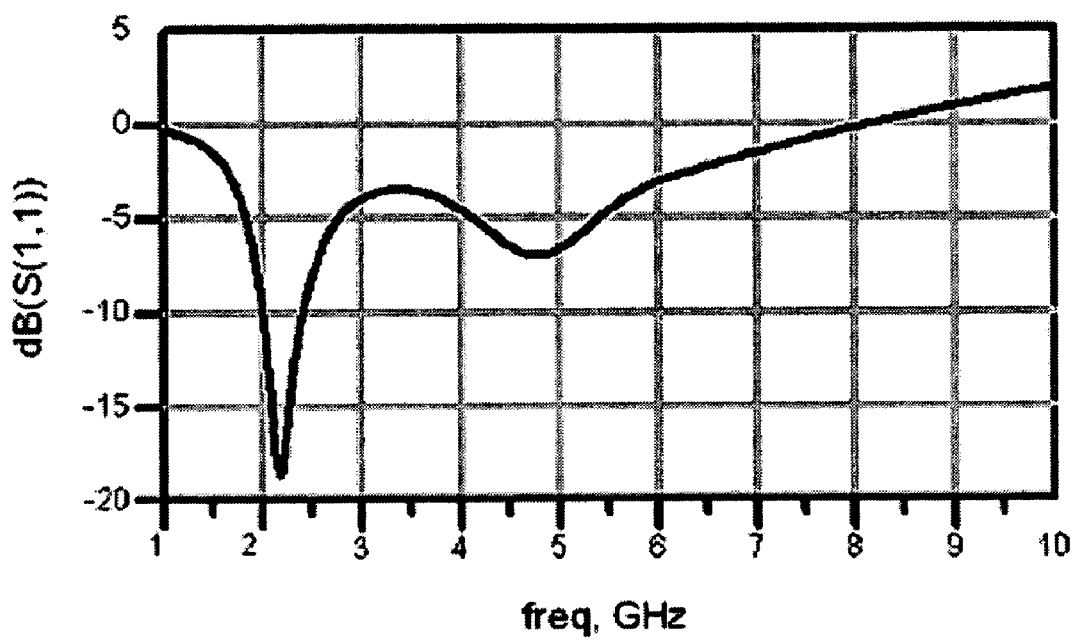

The proposed schematic design methodology is applied to 2.4/5.2-GHz CMOS dual-band mixer design. The dual-band mixer is designed to operate with a 1.8-V power supply by using 0.18 μm CMOS technology. Values of related parameters of the dual-band mixer are shown in Table I. The smallest feature size of the available capacitor library provided from the manufacturer, however, is 100 fF. The main capacitor size is thus modified to fit the cell library and the higher frequency band of the implemented mixer is therefore lowered. The measured return losses of the output port for operating at 5.2-GHz and 2.4-GHz are shown in FIG. 6, wherein (a) represents return loss at 5.2 GHz working frequency band and (b) at 2.2 GHz working frequency band. FIG. 6 shows that the return loss is lower than −10 dB in both bands of interest.

TABLE 1

Component value of the load network

| Parameters | Optimized values | Units |
|---|---|---|
| Higher frequency band | f1 | 5.2 GHz |
| Lower frequency band | f2 | 2.4 GHz |
| Load inductance Lload | 0.94 | nH |
| Main capacitor | C1 | 93 fF |
| Adjust capacitors | C2, C3 | 3280 fF |

Figure 7:
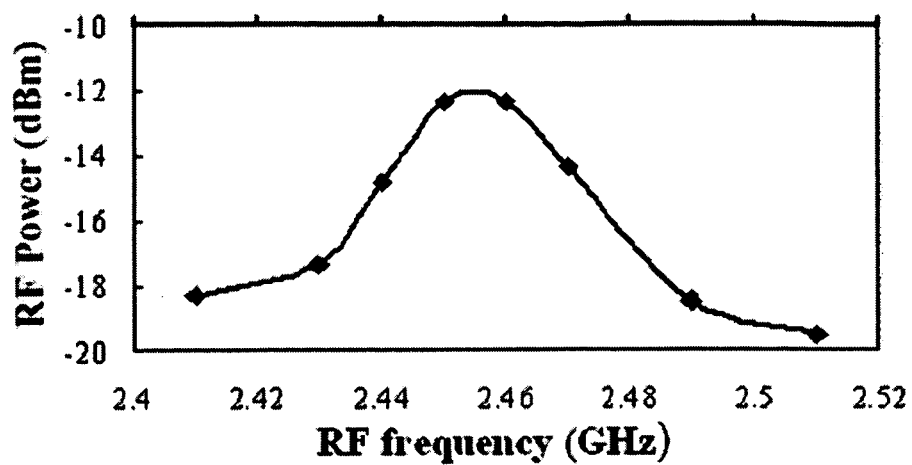
FIG. 7 shows the waveform of output power of one embodiment of the invented dual-band mixer under a lower working frequency.
Figure 8:
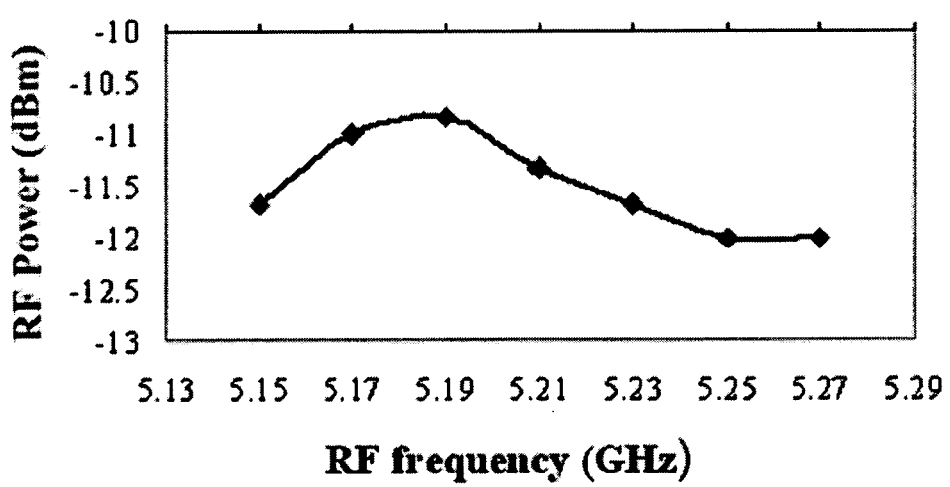
FIG. 8 shows the waveform of output power of one embodiment of the invented dual-band mixer under a higher working frequency.

The output power is measured with a 10-MHz baseband signal. As shown in FIG. 7, the output power for the lower frequency band peaks at 2.46-GHz obtained by a 2.45-GHz LO signal and meets the design specifications. The output power for the higher frequency band as shown in FIG. 8, however, peaks at 5.19-GHz due to the main capacitor being modified.

As the present invention has been shown and described with reference to preferred embodiments thereof, those skilled in the art will recognize that the above and other changes may be made therein without departing from the spirit and scope of the invention.

What is claimed is:

1. A dual-band mixer comprising a differential radio frequency mixer architecture to mix received radio frequency signals with local oscillator signals, wherein output of said mixer is provided with: a load inductor set to perform as load; a main capacitor connected to said load inductor set to generate combined current so to convert differential output of said mixer into single end form; an adjust capacitor set connected in parallel with said main capacitor; and a switch to control connection of said adjust capacitor set and said main capacitor.

2. The dual-band mixer according to claim 1, further comprising a resistive degeneration circuit to suppress third-order distortion of said received radio frequency signals.

3. The dual-band mixer according to claim 1, wherein said load inductor set comprises two inductors with about the same inductance.

4. The dual-band mixer according to claim 1, wherein said adjust capacitor set comprises two capacitors with about the same capacitance.

5. The dual-band mixer according to claim 1, wherein said two capacitors of said adjust capacitor set have about the same capacitance of said main capacitor.

6. The dual-band mixer according to claim 1, wherein said switch is transistor.

7. A dual-band mixer comprising a differential radio frequency mixer architecture to mix received radio frequency signals with local oscillator signals, wherein output of said mixer is provided with: a load inductor set to perform as load; a main capacitor connected to said load inductor set to generate combined current so to convert differential output of said mixer into single end form; an adjust capacitor set connected in parallel with said main capacitor; and a switch to control connection of said adjust capacitor set and said main capacitor;

wherein said load inductor set comprises two inductors with about the same inductance, with the inductances L1 and L2 of:

$$\frac{1}{\sqrt{C_p L_1}} = 2\pi f_1 \quad (2)$$

and $$\frac{1}{\sqrt{C_p L_2}} = 2\pi f_2; \quad (4)$$

wherein f1 represents a higher working frequency and f2 represents a lower working frequency, Cp represents parasite capacitance of said mixer;

capacitance of said main capacitor C1 is:

$$\frac{1}{\sqrt{2 C_1 L_1}} = 2\pi f_1; \quad (3)$$

and said adjust capacitor set comprises two capacitors with about the capacitances C2 and C3 of:

$$C_2 = C_3 = C_p \left( k^2 - \frac{1}{k^2} \right) \quad (6)$$

wherein k=f1/f2.

8. The dual-band mixer according to claim 7, further comprising a resistive degeneration circuit to suppress third-order distortion of said received radio frequency signals.

9. The dual-band mixer according to claim 7, wherein said switch is transistor.

10. A method to design a dual-band mixer, comprising the steps of:

determining structure and form factors of said dual-band, including size of circuit and working frequencies f1 and f2, wherein f1 represents a higher working frequency and f2 represents a lower working frequency;

wherein structure of said dual-band mixer a differential radio frequency mixer architecture to mix received radio frequency signals with local oscillator signals, wherein output of said mixer is provided with: a load inductor set comprising two inductors to perform as load; a main capacitor connected to said load inductor set to generate combined current so to convert differential output of said mixer into single end form; an adjust capacitor set comprising two capacitors and connected in parallel with said main capacitor; and a switch to control connection of said adjust capacitor set and said main capacitor;

calculating parasite capacitance Cp of said mixer;

calculating an equivalent inductor L1 to resonate with said parasite capacitance Cp under said higher working frequency f1 according to the following equation:

$$\frac{1}{\sqrt{C_p L_1}} = 2\pi f_1; \quad (2)$$

calculating an equivalent inductor L1 to resonate with said parasite capacitance Cp under said higher working frequency f1 according to the following equation:

$$\frac{1}{\sqrt{C_p L_2}} = 2\pi f_2; \quad (4)$$

calculating capacitance C1 of said main capacitor according to the following equation:

$$\frac{1}{\sqrt{2 C_1 L_1}} = 2\pi f_1; \quad (3)$$

calculating capacitances C2 and C3 of said two capacitors of said adjust capacitor set according to the following equation:

$$C_2 = C_3 = C_p \left( k^2 - \frac{1}{k^2} \right); \quad (6)$$

wherein k=f1/f2; and applying said L1 and L2 values to said two inductors of said load inductor set.

11. The method according to claim 10, further comprising the steps of checking circuit of design so obtained and modifying said circuit design.

* * * * *